United States Patent
Kerschbaumer et al.

(10) Patent No.: US 11,158,491 B2
(45) Date of Patent: Oct. 26, 2021

(54) TARGET ASSEMBLY FOR SAFE AND ECONOMIC EVAPORATION OF BRITTLE MATERIALS

(71) Applicant: Oerlikon Surface Solutions AG, Pfäffikon, Pfäffikon (CH)

(72) Inventors: Joerg Kerschbaumer, Feldkirch (AT); Hamid Bolvardi, Chur (CH); Siegfried Krassnitzer, Feldkirch (AT); Markus Esselbach, Feldkirch (AT)

(73) Assignee: Oerlikon Surface Solutions AG, Pfäffikon, Pfäffikon (CH)

( * ) Notice: Subject to any disclaimer, the term of this patent is extended or adjusted under 35 U.S.C. 154(b) by 0 days.

(21) Appl. No.: 16/618,786

(22) PCT Filed: May 30, 2018

(86) PCT No.: PCT/EP2018/064281
§ 371 (c)(1),
(2) Date: Dec. 2, 2019

(87) PCT Pub. No.: WO2018/220067
PCT Pub. Date: Dec. 6, 2018

(65) Prior Publication Data
US 2020/0090915 A1    Mar. 19, 2020

(30) Foreign Application Priority Data
Jun. 1, 2017   (CH) ..................... 00708/17

(51) Int. Cl.
*H01J 37/34* (2006.01)
*C23C 14/14* (2006.01)
*C23C 14/34* (2006.01)

(52) U.S. Cl.
CPC .......... *H01J 37/3423* (2013.01); *C23C 14/14* (2013.01); *C23C 14/3407* (2013.01); *H01J 37/3435* (2013.01)

(58) Field of Classification Search
CPC ............... H01J 37/3414; H01J 37/3417; H01J 37/3423; H01J 37/3432; H01J 37/3435; C23C 14/14; C23C 14/34
(Continued)

(56) References Cited

U.S. PATENT DOCUMENTS

| | | | | |
|---|---|---|---|---|
| 4,820,397 A | * | 4/1989 | Fielder | H01J 37/3435 204/298.12 |
| 5,676,810 A | * | 10/1997 | Schwendener | C23C 14/3407 204/298.09 |
| 6,358,382 B1 | * | 3/2002 | Stucki | H01J 37/3435 204/298.12 |

FOREIGN PATENT DOCUMENTS

| | | |
|---|---|---|
| DE | 4223091 C1 | 7/1993 |
| EP | 0393344 A1 | 10/1990 |

(Continued)

*Primary Examiner* — Rodney G McDonald (57) ABSTRACT

The present invention discloses a target assembly which allows safe, fracture-free and economic operation of target materials with low fracture toughness and/or bending strength during arc evaporation processes as well as in sputtering processes. The present invention discloses a target assembly for PVD processes, comprising a target, and a target holding device (20), characterized in that the target (10) comprises a first bayonet lock and the target holding device (20) comprises a counterbody for the first bayonet lock of the target and a second bayonet lock for engaging the target assembly in the cooling means of the deposition chamber.

11 Claims, 8 Drawing Sheets

(58) Field of Classification Search
USPC .................................... 204/298.12, 298.13
See application file for complete search history.

(56) References Cited

FOREIGN PATENT DOCUMENTS

EP  0512456 A1  11/1992
WO  2014166620 A1  10/2014

* cited by examiner

TARGET ASSEMBLY FOR SAFE AND ECONOMIC EVAPORATION OF BRITTLE MATERIALS

STATE OF THE ART

Targets made of brittle materials are known to often suffer from breakage during operation, when they are used as cathode in physical vapor deposition (PVD) processes. This can lead to defect targets and cooling plates as well as inferior coated customer tools. This imposes additionally maintenance time to production line and interrupt the production. The breakage of the targets usually starts at that point of the target, where the highest mechanical stresses arise during operation. This critical point of the target geometry is often observed at e.g. sharp edges or thin sections of the target, but can also be at the target circumference or surface, depending on the local stress maximum. The mechanical stress stems from the pressure of the cooling means on the backside of the target and supersedes with the thermal stresses in the target during operation. In the context of the present application, the term brittle refers to metallic and ceramic materials with a fracture toughness of less than 40 $MPa*m^{-1/2}$ or bending strength of less than 500 MPa.

Standard target designs for PVD systems commonly exhibit disc or plate shape geometries and consist of the target material to be evaporated during the arc or sputtering process. Such disc plate targets are typically mounted inside a deposition chamber on a cooling plate by a target holder or directly fixed via e.g. screws. The drawback here is that local stress due to screws induce cracking during operation.

EP0393344A1 discloses an attempt using a frame structure that keeps a target plate pressed against the cooling plate when the cooling fluid is active. The target plate exhibits a step, which ensures that the target plate can be slit in the frame structure. The drawback of this assembly is however that a second material of the frame structure faces the arc or plasma discharge during operation, which can cause unintended evaporation of the frame structure and is thus not suitable for stable process conditions and high quality coatings.

Figure 8:
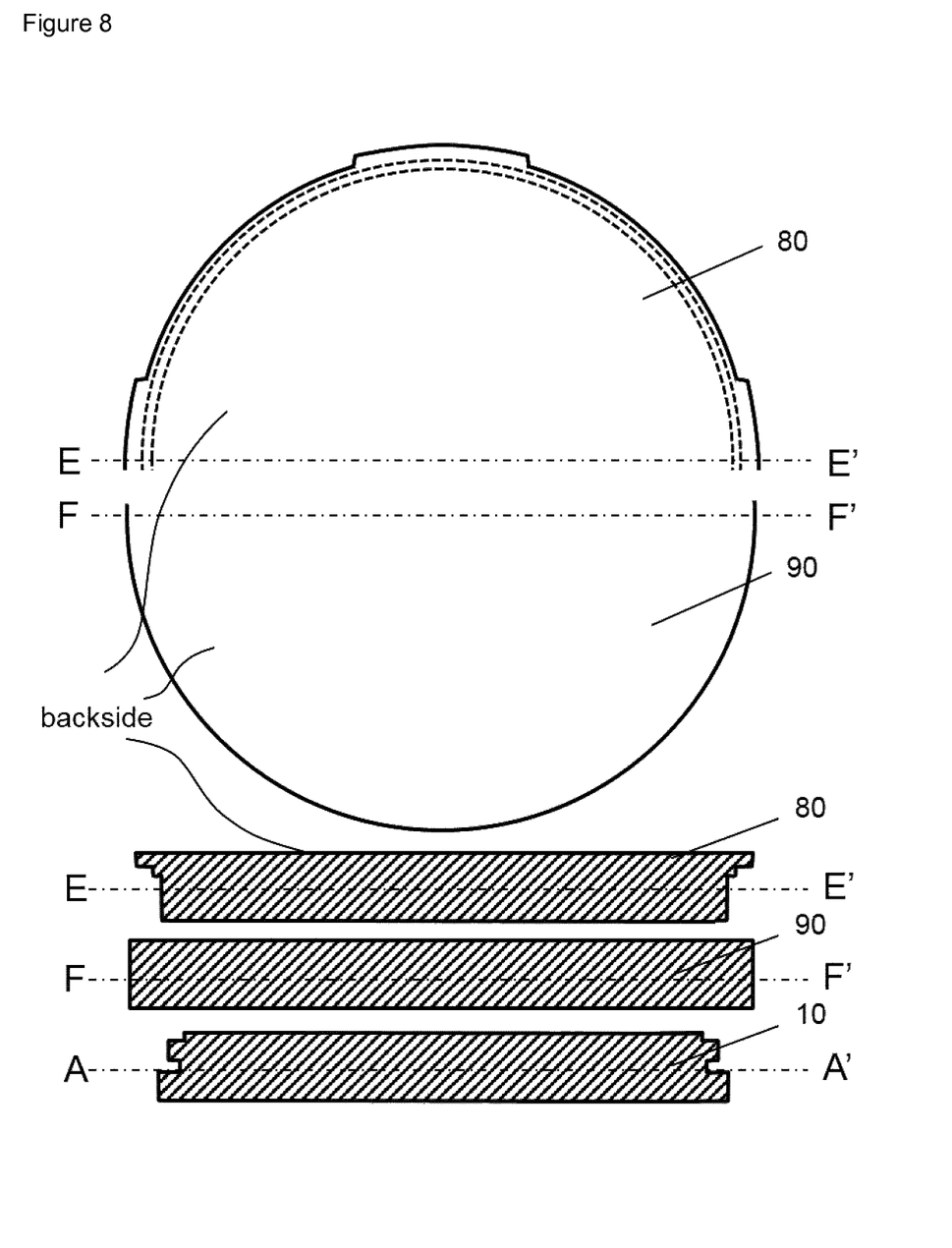

EP0512456A1 introduces a target design, which uses protrusions along the circumference of the target, which allow that the target can be rotated into fixation means of the deposition chamber. The target protrusions are explained to interact with counterbody of the deposition chamber akin to a "bayonet lock". An exemplary scheme of such a "standard target" design is depicted in FIG. 8. Akin to EP0393344A1, it is described in EP0512456A1 that the back pressure of the active cooling plate is used to press the target plate against the fixation means, which ensures a good thermal contact between the target backside and the cooling plate. In this attempt the whole target plate including the protrusions are made of the material to be evaporated, which causes however considerable stresses in the bayonet region of the target and is thus unsuitable in the case of brittle target materials.

In the past one idea has been disclosed to improve the durability of brittle targets during sputtering in WO2014166620A1. There, the brittle target material was replaced by high strength steel along the outer diameter of the target plate, where frequently cracks can be observed. Nevertheless, the suggested solution of WO2014166620A1 is not appropriate for operation of targets made of brittle materials as cathodes in arc evaporation processes. Under certain conditions the risk of possible evaporation of the target holder remains.

The present invention thus tries to overcome the drawbacks of known target geometries where brittle target materials often suffer from breakage during operation as cathodes in PVD processes.

Therefore an attempt has been made in this invention to eliminate the risk of crack initiation by implementing a new design for the targets without exposing a second material of a target holder towards the arc or sputter plasma.

Generally, the reason for brittle failure is assumed to stem from several factors. One of them is the local stress evolution in the target during arc evaporation or sputtering. Target materials with high melting point and/or hexagonal crystal structure, such as e.g. elemental Cr, Mo, W or the like, or compound targets such as Ti—Cr, Mo—Cr, Mo—Hf, and other binary or ternary mixtures of high-melting point elements or target materials, are prone to brittle failure. In particular, during arc evaporation local heating occurs at the surface of the target while the target backside is typically directly or indirectly cooled. The different thermal expansion on the plasma side versus the cooling side can lead to high stresses in the target during operation, which is superposed by mechanical stress from the cooling plate that presses against the backside of the target. Akin in this regard are also ceramic target materials, such as e.g. borides like $TiB_2$, or nitrides like TiN, CrN or oxides. Other factors are the typically low thermal expansion coefficients and/or low thermal conductivities of such target materials, which can promote the evolution of thermal stresses in the target. Besides this, the target design has to ensure that the target is electrically contacted and well cooled during operation.

During arc evaporation the motion of the arc spot can be influenced by various techniques, such as arc steering by e.g. a constant or variable magnetic field arrangement or local hardware arrangements which enable for sufficient connection of the free electrons to an anode. It is however often observed that the arc spot moves across the whole target surface, especially when no arc steering is used. This arc evaporation mode is called "random arc" motion. In case of state of the art target design solutions, the mechanical target instabilities are sought to be overcome by using a target holder of a second material, such as in WO2014166620A1. This target holder however is usually of the same height as the target thickness and forms a "cage" around the target material to be evaporated, which can lead to the unintended evaporation of secondary material from the target holder in case of arc evaporation.

The inventors thus propose a solution for improving the mechanical stability of brittle target materials and thus the improved capability to bear thermal loads on the target surface, without applying a secondary material that faces the evaporation zone of the target surface. The inventive target design is sought to be suitable for arc evaporation, but can also be used for DC- or RF-sputtering, as well as HIPIMS.

OBJECTIVE OF THE INVENTION

The objective of the present invention is to provide a target assembly which allows safe, fracture-free and economic operation of target materials with limit fracture toughness and/or bending strength during arc evaporation processes as well as in sputtering processes. The inventive target assembly should preferably allow exposing only target material to be evaporated during the coating process. Hence, only target material and no secondary material of the target holder faces the arc discharge or the plasma during sputtering.

DESCRIPTION OF THE PRESENT INVENTION

Figure 1:
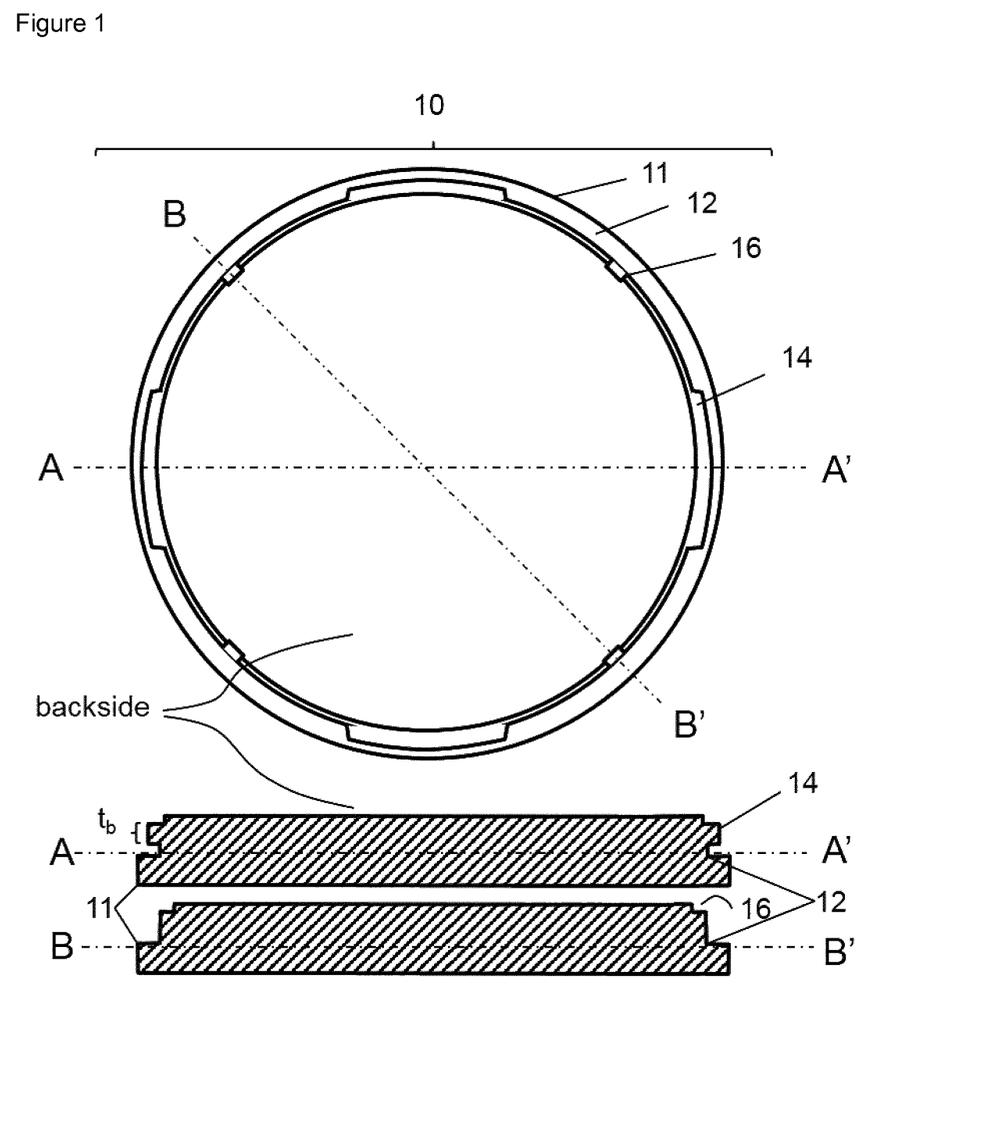
Figure 2:
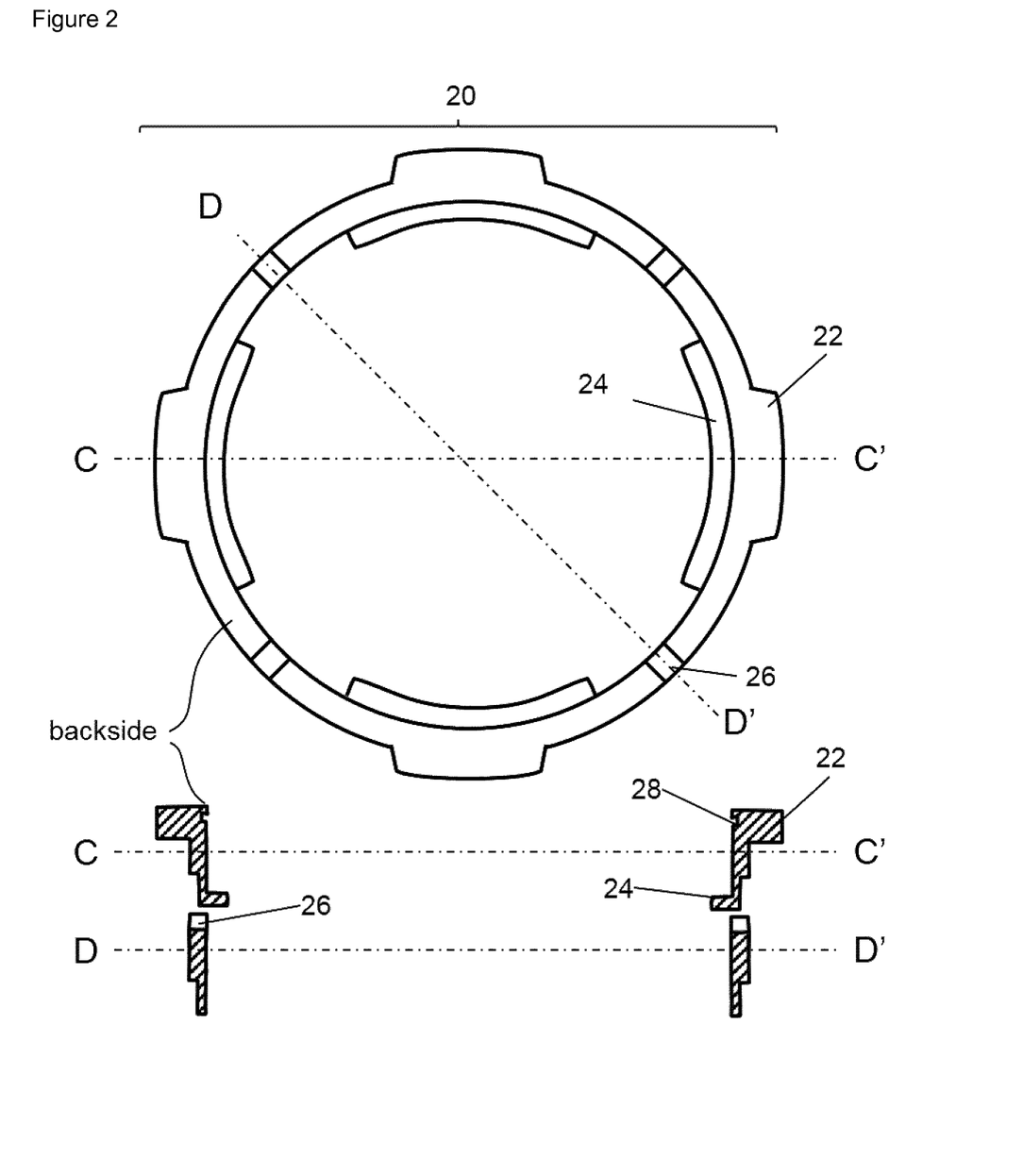
Figure 3:
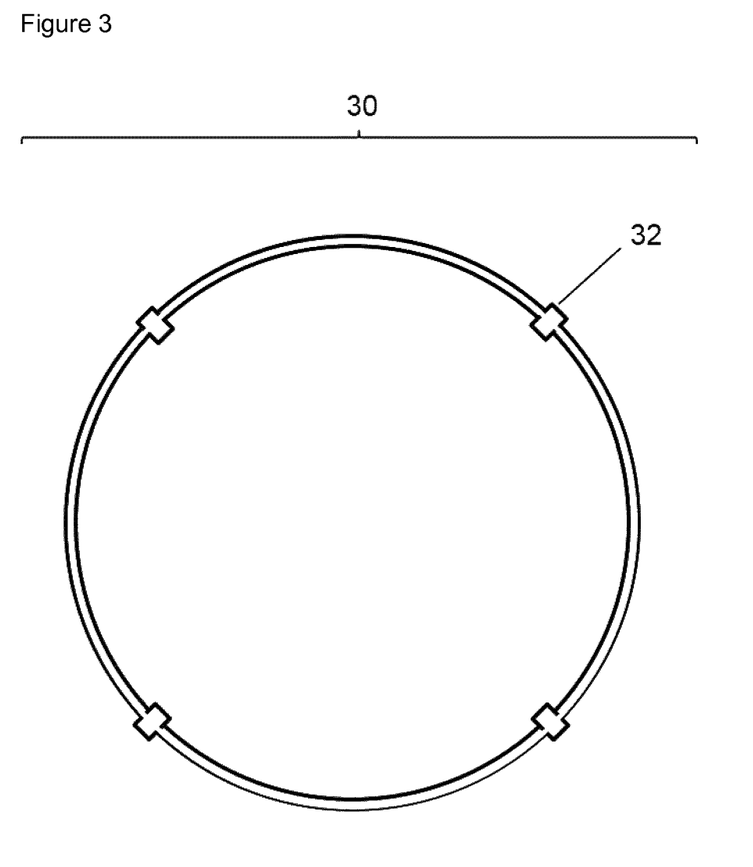
Figure 4:
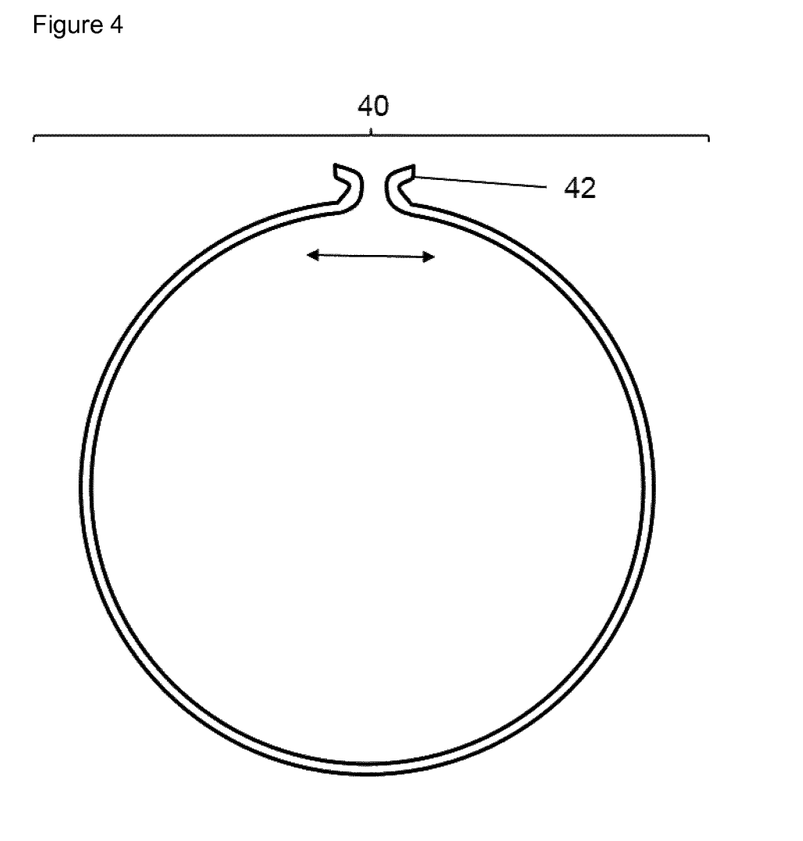
Figure 5:
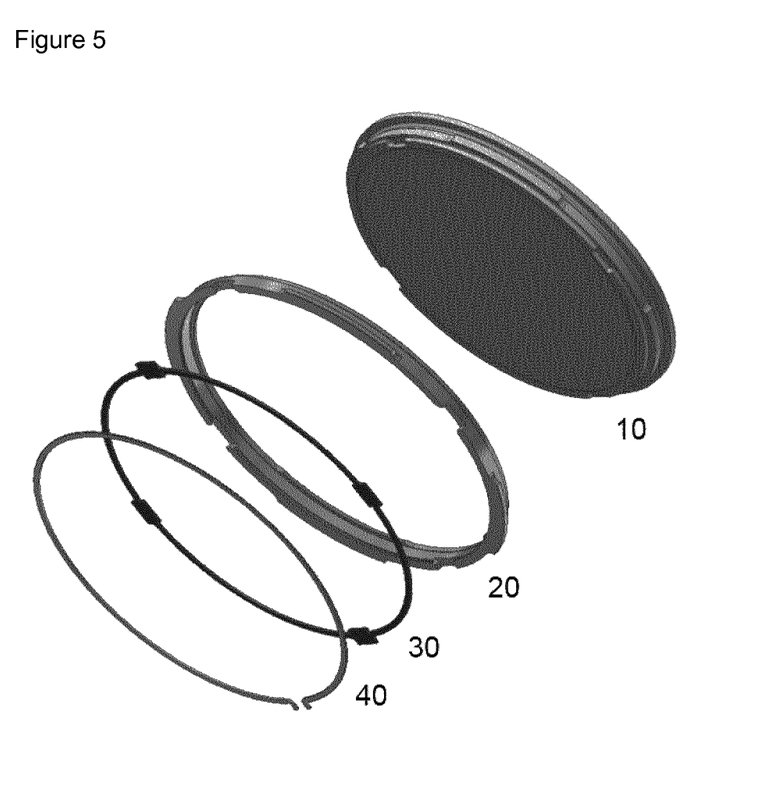

The inventive target assembly comprises an inventive target 10, and a holding device 20, schematically shown in FIGS. 1 and 2, respectively. Preferably the target 10 and the holding device 20 are used in combination with a locking device 30 and a spring 40, as schematically shown in FIGS. 3, 4 and 5, respectively. The target 10, exhibits a front side, which is exposed to the arc or plasma discharge. The backside of the target comprises specific geometrical features which enable several functions and correlating advantages during operation, such as e.g.:
- use of the whole target surface exposed to the arc or plasma discharge for evaporation of target material
- use of the target over a wide utilization range
- combination of the target with a target holding device 20
- good electrical and improved thermal capability of the target
- improved resistance during operation at high temperatures of the brittle target material
- use of typically brittle target materials, such as materials with hexagonal crystal structure and/or high-melting point, like refractory metals (e.g. Cr, Mo, W), mixtures of such metals, various oxides, carbides and borides.

The inventive target design is primarily intended for disc shaped targets, although the inventive concept could also be applied to plate shaped targets if minor modifications of the target holding device are applied. The following discussion therefore deals only with disc shaped geometries for the sake of clarity.

The inventive target design can be applied to any target material for arc, as well as sputtering processes, however is most suitable for brittle target materials.

In the context of the present application the word "bayonet" or "bayonet lock" refers to a locking mechanism whereby any protrusions of the target 10 and/or the target holding device 20 reach engage with a corresponding counterbody. The counterbody can be the target holding device 20 or alternatively the cooling means for uptake of the target in the deposition chamber (not further discussed in the present application). The protrusions of the bayonet lock therefore fit into corresponding undercuts or openings of the counterbody The inventive target assembly comprises two bayonet locks. A first bayonet lock, which contacts the target 10 in the target holding device 20, and a second bayonet lock which fixes the whole inventive target assembly in the cooling means of a deposition chamber. After rotation of the target 10 and/or target holding device 20 the surfaces of the respective protrusions and the counterbody oppose each other. When pressure is applied on the backside of the target by the cooling means, the individual protrusions and the corresponding opposite counterbody surfaces engage and "lock" the inventive target assembly.

The diameter of the inventive target can be almost any arbitrary number which is chosen in order to meet the requirements of the individual coating machine. Typical outer target diameters of commercially available arc, sputtering or HIPIMS systems range from 45 to 200 mm, preferably between 60 and 150 mm. In a specific example, the diameter of the target is chosen with 150 mm.

In a target assembly according to the present invention, the inventive target 10, schematically indicated in FIGS. 1 and 5, is constructed in order to fit into a holding device 20, which can e.g. be a high strength steel bayonet ring 20 as schematically presented in FIGS. 2 and 5. The target 10 comprises means for uptake of the holding device 20, which can be e.g. protrusions that work together with the holding device 20 as a bayonet lock. A relative rotation of the target 10 with respect to the holding device 20 in clockwise or counter-clockwise rotation is needed to have them semi-locked. To prevent the risk of counter rotation and to have them completely locked or to prevent unintended disassembly, a locking device 30 is preferably used, which is exemplarily shown in FIGS. 3 and 5, that can be e.g. a centering ring with fixation means. The target assembly can thus be fixed by a spring 40 (see FIGS. 4 and 5), which prevents the optional locking device 30 from getting loose from the holding device 20 and target 10. When all parts are assembled together and locked properly, the assembled target can be used as a standard target in production. No additional hardware or handling for the target is required. By the end of the target lifetime, the assembled target can be easily dismounted and the parts 20, 30 and 40 can be reused for the next targets again.

FURTHER DETAILS AND PREFERRED EMBODIMENTS OF THE PRESENT INVENTION

The inventive target comprises a circumferential recess 12, which is formed between the front side being exposed to evaporation and which is intended to "hide" the target holding device from the arc discharge or plasma. The recess 12 delimits the frontside of the target from the target body towards the backside of the target, thereby forming the inner target diameter $D_2$ being smaller than $D_1$. The portion of the target outer diameter $D_1$ which protrudes over the inner diameter $D_2$ is referred as the first portion of the target and exhibits a target nose 11. The region of the inner target diameter $D_2$ is referred as second target portion. This can be seen from the cross-section of the target 10 along the axis A-A' and B-B' in FIG. 1. Further the target comprises, at least two, preferably three or more target protrusions 14, which are radially distributed along the circumference of the target. These target protrusions 14 enable for fixing the target in the target holding device 20 and must not protrude over the outer diameter $D_1$ of the target if watched from the front side of the target. This condition should leave sufficient space in radial dimension for the holding device 20. The target portion with the target protrusions 14 is referred as third target portion.

The target can further comprise at least two, preferably three or more target grooves 16, which are also radially distributed along the backside of the target and reach into the target body, as schematically shown in FIG. 1. These target grooves 16 reach as deep into the target as necessary to take a locking device 30 fully up.

Usually, every notch in brittle materials is regarded as a typical source for cracks. Different to state-of-the-art disc or plate shaped targets, the inventors surprisingly found that the proposed target 10, comprising the circumferential recess 12, target protrusions 14, and optional target grooves 16, can bear higher mechanical loads during operation compared to a "cage-like" target holder, as known from the state-of-the-art, e.g. WO2014166620A1. It is assumed that the mechanical load is better distributed via the interaction of target protrusions 14 and the inner protrusions of the target holding device 24, as explained below.

High loads during operation typically arise from the pressure of the cooling means on the backside of the target and the different thermal expansion of the frontside and the backside, which are induced by the high temperature on the frontside of the target due to the arc or plasma discharge. To the inventors surprise the inventive target design enables operation at higher arc currents or increased sputtering power, compared to the state-of-the-art target designs.

Several conditions for the target design were found to be beneficial (see also FIG. 6):
- the depth of the recess 12 in radial direction, $d_r$, expressed by half of the difference between outer target diameter $D_1$ and inner diameter $D_2$, or should be in the range of 2 to 7.5% of $D_1$, preferably 2.5 to 4.5%.
- the thickness of the target nose, $t_n$, can be between 60% to 150% of $d_r$, while best results have been achieved with a ratio of 75%.
- the height of the recess depends on the thickness of the inner protrusions 24 of the target holding device 20.

The selection of optimum values strongly depends on target thickness and diameter, but can be seen as a rule of thumb for target design.

This means e.g. that for a target with outer diameter $D_1$, of 150 mm a recess depth, $d_r$, can be chosen between 3.0 to 11.25 mm, preferably between 3.8 and 6.8 mm, which results for 75% of $d_r$ in resulting thicknesses of the target nose, $t_n$, of 2.3 to 8.4 mm, and preferably of 2.9 to 5.1 mm, respectively.

The most important condition for the inventive target design is the thickness of the target protrusion 14 in axial direction, also referred as target bayonet, $t_b$. It was found that with the inventive target design the mechanical stresses, as mentioned above, are preferably distributed via the target protrusions 14 into the target holding device 20. The minimum value of $t_b$ depends from several factors like e.g.:
- the geometry of outer ($D_1$) and inner ($D_2$) target diameter,
- the surface area of the target backside being in contact with the cooling means,
- the pressure of the cooling means towards the target during operation,
- the mechanical properties of the target material.

The geometric factors can be chosen by the person skilled in the art fitting best to the needs of the individual deposition source. Basically, the inner target diameter $D_2$ should thereby be chosen as small as to allow sufficient depth for the inner protrusions 24 of the target holding device 20 to smoothly "hook in" into the target 10. This ensures that sufficient surface area of the overlapping inner protrusions 24 and the target protrusions 14 to provide sufficient mechanical strength of the target assembly. On the other hand the inner target diameter 20 should be as large as possible to maximize the target volume being effective for evaporation during operation.

Figure 6:
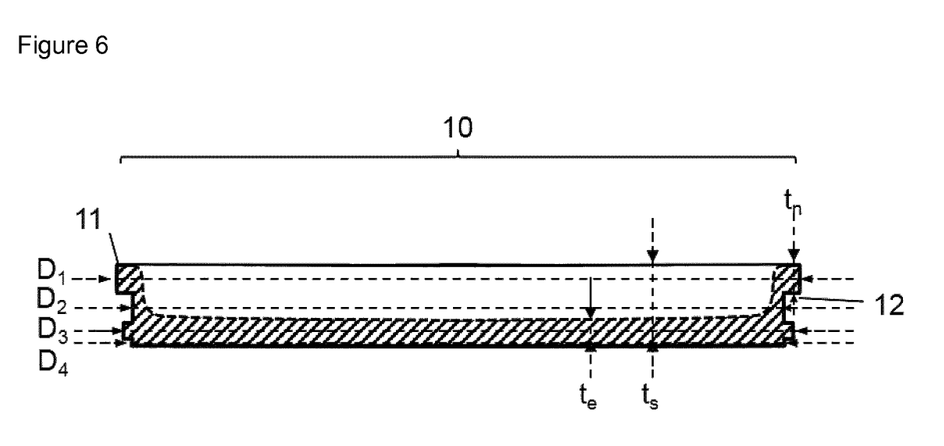

The inventors found that as a rule of thumb, minimum value of $t_b$ should be 15%, preferably 25% and even more preferably 33% of the initial target thickness $t_s$, see also FIGS. 1 and 6. In the case of a Cr-target with $t_s$ of 12 mm, it was found that the thickness of the target protrusion $t_b$ should be at least 1.8 mm, preferably 3.6 mm, and even more preferably 4 mm. Additionally, the maximum value of $t_b$ is limited by the minimum thickness of the inner protrusions 24 of the holding device 20. The selection of optimum values of $t_b$ thus also strongly depends on target thickness and diameter, but can be seen as a rule of thumb for target design. The maximum value of $t_b$ is limited by the minimum thickness of the inner protrusions 24 of the target holding device 20 in axial direction, to meet the mechanical requirements and prevent mechanical failure of the inner protrusions 24 of the target holding device 20 during operation. Additionally a small clearance between the target protrusions 14 and the inner protrusions 24 of the target holding device 20 has to be foreseen in the design to allow a smooth assembly. A maximum value of 85% of the initial target thickness $t_s$ was found to meet these requirements.

The pressure of the cooling plate is typically between 1 and 5 bar. However, the mechanical properties and hereby especially the bending strength of the target material is difficult to determine, because it strongly depends on the target material composition, grain size, method of production.

The schematic illustration in FIG. 6 shows that from the cross-section of a virgin target (solid outer lines) with an initial target thickness $t_s$, only little target material (marked by the hatched area, surrounded by dashed line) with target thickness, $t_e$, remains at end of lifetime. The above mentioned values of $t_n$ and $d_r$ are important, as a target should be even mechanically stable at the end of its lifetime. Even brittle targets can thus be used until a critical lower target thickness, $t_e$, is reached if the given ratio is used in a conservative manner.

The values $t_n$ and $d_r$ can however depend on the used target materials (e.g. metallic, ceramic or mixtures of metals and/or ceramics) and its specific properties, as well as the mechanical loads stemming from e.g. a cooling plate in the back of the target or other geometrical considerations.

In the presented example of a metallic Cr-target in FIG. 1, four target protrusions 14 are shown, which are equally distributed along the circumference of the target backside. The number of target protrusions, as well as their circumferential length, have to be selected by the person skilled in the art in order to meet the requirements of the individual deposition machine with the goal to achieve optimum stability of the target.

The front side of the target which is intended to be evaporated during the deposition process, is initially a plane surface. The front surface can be additionally machined (e.g. by turning, milling, grinding, lapping or electrodischarge machining) in a way that the surface roughness of the target is reduced. In a similar manner, the outer and inner diameters $D_1$ and $D_2$, as well as the target protrusions 14, target grooves 16 and the resulting recess 12, can be machined. Optimum results are achieved if a target surface roughness of $R_a<5$ μm, preferably $R_a<3.5$ μm is achieved.

As schematically indicated in FIG. 2, the corresponding target holding device 20 is intended to connect the target 10 to the cooling means and thus the deposition chamber, comprising at least two sets of outer and inner protrusions. The outer protrusions 22 are intended to lock the whole target assembly in the bayonet lock of the deposition source inside the deposition chamber, which brings the target backside in contact with the cooling plate. A corresponding mechanism is known by the expert in the field and thus needs no further in-depth explanation. However, the inner protrusions 24 of the holding device 20, are intended to fit into the corresponding areas, which are left open between the target protrusions 14 and the target nose 11, namely they fit into the recess 12. The number of inner protrusions 24 and corresponding target protrusions 14 has to be the same. The number of outer protrusions 22 and inner protrusions 24 may differ from each other, but preferably they have the same number as exemplarily shown in FIG. 2. The arrangement turned out to be optimal if pairs of 4 target protrusions 14 and inner protrusions 24 of the holding device are chosen. As explained above the target protrusions 14 need to exhibit sufficient mechanical strength and thus at least a minimum thickness in axial direction of the target thickness. The holding device 20 should exhibit a height that after assembly with the target 10 the backside of the target 10 is even with the backside of the target holding device 20. This allows that the target backside is fully in contact with the target cooling means of the depositions chamber.

In the example chosen, the target holding device 20 and the target 10 can be easily assembled and by a 45 degree clockwise motion of the target 10 versus the holding device 20 a semi-locked state is achieved. The resulting overlap of the target protrusions 14 and the inner protrusions 24 of the holding device 20 ensure that a mechanical load on the target backside is effectively forwarded into the holding device and that mechanical stress is lowered on the target surface and the outer diameter of the target. The expert knows how to choose the corresponding thicknesses of the outer 22 and inner 24 protrusions to ensure compatibility towards the target 10 as well as the deposition chamber or cooling system. Sufficient clearance for easy motion during assembly of the individual parts has to be foreseen by the expert. The cross-sections of FIG. 2, along the axis C-C' and D-D', exhibit some exemplary details how the holding device 20, in the present case a high-strength stainless steel ring, can be shaped in order to meet the above mentioned requirements.

In another embodiment of the invention, a locking device 30 and a spring 40 are used. Therefore, an additional step in radial direction of the target 10 has to be foreseen ($D_4$ in FIG. 6), which delimits the target protrusions 14 from the target body towards the backside of the target. Additionally, the holding device 20 can comprise holder grooves 26, which are manufactured in a way that they directly oppose the target grooves 16 of the target body, after the target 10 is being assembled with the holding device 20 and rotated to achieve the semi-locked state. The optional target grooves 16 and holder grooves 26 are intended to receive fixation ears 32 of an optional locking device 30 in a way that rotational motion can be effectively blocked. Therefore the depth of the target grooves 16, as well as, holder grooves 26, respectively, is determined by the thickness of the utilized locking device 30. In the present case a high-strength steel ring with a thickness of 1 mm was used as locking device (see e.g. FIGS. 2 and 5 in correspondence). The thickness of this locking device 30 can however also be significantly higher, e.g. 2 to 5 mm, depending on the target thickness and diameter. The fixation ears 32 are meant to reach from the fixation ring in radial direction into the holder grooves 26 but not beyond. Similar the opposite side of the fixation ears 32 reach in radial direction into the target grooves 16.

The holding device 20 can comprise a circumferential inner recess 28, which can be seen in FIG. 2, cross-section C-C'. This inner recess 28 has a depth of only 1 to 2 mm and can be regarded as uptake for a spring 40. When the target assembly is built up of the target 10 with the holding device 20 and the optional locking device 30, as described above, the spring 40 is easily pressed (e.g. by hand) in the remaining circumferential trench directly on the locking device 30. Due to its spring character, the spring 40 opens and is received by the inner recess 28 of the holding device 20, where it hooks in and prevents the locking device 30 from unintentional disassembly.

As can be seen from the schematic drawing in FIG. 4, the spring 40 exhibits hooks 42 on either side of the flat spring 40. These hooks can be hidden in the holder grooves 26 of the holding device 20 when the spring is attached, which ensures an even backside of the whole target assembly. These hooks 42 are means for easy handling and intentional disassembly of the target after use. The spring 40 can be as well made of any metal, preferably stainless or high-strength steel, that it exhibits sufficient spring characteristics and is preferably flat to best fit into the whole target assembly. The material of the target holding device 20 has to be chosen in order to be electrically conductive and to bear the arising mechanical loads during operation, whereby stainless or high-strength steel was found to meet these requirements best, although other metals or electrically conductive ceramics could be imagined.

Figure 7:
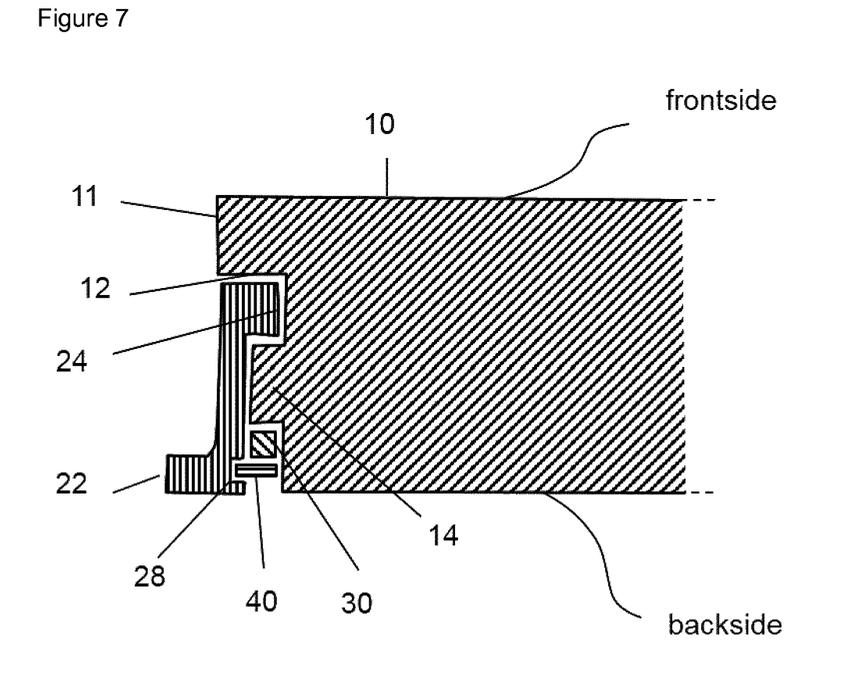

As border conditions for the whole inventive target assembly it is important that the backside of the target 10 is even with the holding device 20. The situation is schematically presented in FIG. 7, where a detail of the cross-section of an assembled target is displayed. It is important that all "sharp" corners are avoided, meaning that edge radii during machining should not be less than 0.5 mm, preferably not less than 0.25 mm.

An explosion view of the inventive target assembly comprising a target 10, a target holding device 20, as well as an optional locking device 30 and a spring 40 is schematically shown in FIG. 5.

A benefit of the inventive target assembly is that the target holding device 20 can act as an adapter for the cooling means and/or uptakes of existing deposition plants, provided that the uptakes of the existing coaters exhibit a bayonet lock as counterbody for the inventive target 10 and/or the target locking device 20. Hence expensive modifications of already installed cooling means or deposition plants are not necessary.

Another benefit of the inventive target assembly via typical standard target designs exposing all the same projected area towards the arc or plasma discharge is schematically shown in FIG. 8. From this comparison one can clearly see the economic advantage of the present invention, since the inventive target 10 requires less material compared to the other targets, while at the same time overcoming the drawbacks of the "standard" targets. The cross-section A-A' refers to the inventive target 10, the cross-section F-F' refers to a simple disc-shaped target 90 and the cross-section E-E' to a state-of-the-art target 80. All targets are fully made of the material to be evaporated, however the amount of material necessary for its production differs. As explained above, the state-of-the-art target 80 exhibits protrusions which are part of a bayonet lock and is not suitable for brittle target materials. To achieve the same area of target surface exposed to the plasma, a full disc-shaped target 90 has to be manufactured with a larger diameter because the frame structure which fixes the target to the cooling plate blocks a significant amount of target material in the border region. This material cannot be evaporated and is thus "lost" for production. In the case of expensive target materials this unused target volume becomes of economic importance. The present inventive target however requires the lowest amount of target material, exposes only material to be evaporated towards the arc or plasma discharge and finally improves the mechanical stability, which ensures save operation at a high degree of possible target consumption.

The presented inventive target assembly helps to overcome brittle failure during arc deposition as well as plasma processing. It is easy to mount and disassemble after use. It can be used many times and enables for higher consumption of often expensive target materials. In the case of Chromium, it is helpful to avoid cracks and the need for premature change of the targets, which effectively enhances lifetime of the targets, saves costs and time during production.

The invention claimed is:

1. A target assembly for PVD processes comprising:
   a target for operation in an arc or sputtering plasma, and
   a target holding device, wherein the target comprises a first bayonet lock and the target holding device comprises a counterbody for the first bayonet lock of the target and a second bayonet lock for engaging the target assembly in a cooling means of a deposition chamber, wherein the target further comprises:
- a target front side to be exposed to the arc or sputtering plasma during operation which exhibits a first outer diameter $D_1$ being a largest diameter of the target corresponding to a first portion of the target, and a second inner diameter $D_2$ corresponding to a second portion of the target being smaller than $D_1$, and
- a target backside designed to be in contact with the cooling means, and
- at least two target protrusions in a third portion of the target, which protrude along a circumference of the target body over the inner diameter $D_2$ in a radial direction but do not protrude over the outer diameter $D_1$, the target protrusions thereby form a first part of the first bayonet lock, and the target holding device further comprises:
- at least two sets of outer and inner protrusions, wherein the inner protrusions form the counterbody for the first bayonet lock of the target protrusions and the outer protrusions form the second bayonet lock for locking the target in the deposition chamber; and wherein the target holding device has a height that enables the target backside to be even with a backside of the target holding device after assembly with the target.

2. The target assembly according to claim 1, wherein a thickness, $t_b$, of the target protrusions in an axial direction, which is a target thickness direction, is between 15% and 85% of an initial target thickness, $t_s$.

3. The target assembly according to claim 1, wherein the target exhibits a recess in the radial direction with a recess depth $d_r$, expressed by half of a difference between the outer target diameter $D_1$ and the inner diameter $D_2$ in a range of 2 to 7.5% of $D_1$.

4. The target assembly according to claim 3, wherein the target exhibits a target nose with a thickness $t_n$, in a range of 60% to 150% of $d_r$.

5. The target assembly according to claim 1, wherein a number of the inner protrusions of the target holding device is equal to a number of the outer protrusions.

6. The target assembly according to claim 3, wherein a thickness of the inner protrusions is less a height of the target recess of the target.

7. The target assembly according to claim 1, wherein the target and the target holding device comprise at least two target grooves in the target and at least two holder grooves in the target holding device as an uptake for a locking device.

8. The target assembly according to claim 7, wherein the target assembly comprises the locking device for locking the target with the target holding device against unintentional counterrotation.

9. The target assembly according to claim 8, wherein the locking device exhibits fixation ears.

10. The target assembly according to claim 7, wherein the target holding device exhibits a circumferential notch along an inner side of the target holding device as an uptake for a spring.

11. The target assembly according to claim 10, wherein the target assembly comprises the spring as a lock against unintentional disassembly of the target assembly.

* * * * *